United States Patent [19]

Okubo et al.

[11] 4,286,154

[45] Aug. 25, 1981

[54] METHOD OF DETECTING A MARK BY AN ELECTRON BEAM AND AN APPARATUS THEREFOR

[75] Inventors: Tsuneo Okubo, Hachioji; Nobuo Hamamoto, Hinodemachi; Kazuo Ichino, Hameiramachi, all of Japan

[73] Assignees: Hitachi, Ltd.; Nippon Telegraph & Telephone Public Corporation, both of Tokyo, Japan

[21] Appl. No.: 97,125

[22] Filed: Nov. 26, 1979

[30] Foreign Application Priority Data

Nov. 24, 1978 [JP] Japan ................... 53-144135

[51] Int. Cl.³ .............................. G01N 23/00
[52] U.S. Cl. ..................... 250/307; 250/310; 250/492 A
[58] Field of Search ............ 250/310, 307, 311, 396, 250/397; 313/351

[56] References Cited

U.S. PATENT DOCUMENTS

| | | | |
|---|---|---|---|
| 3,535,516 | 10/1970 | Munakata | 250/310 |
| 4,063,091 | 12/1977 | Gee | 250/310 |

*Primary Examiner*—Bruce C. Anderson
*Attorney, Agent, or Firm*—Craig and Antonelli

[57] ABSTRACT

This invention relates to a method of detecting a mark by an electron beam, the mark being provided on a sample, which includes the steps of scanning the electron beam over an area of the mark in such a manner that the electron beam is subjected to chopping by sampling pulses having a higher frequency than the scanning frequency, eliminating a component of noise from a detected signal representative of the mark, synchronously rectifying the detected mark signal, binary-coding the detected mark signal as compared with a suitable threshold value, and detecting a position of the mark by using the binary-coded signal.

14 Claims, 4 Drawing Figures

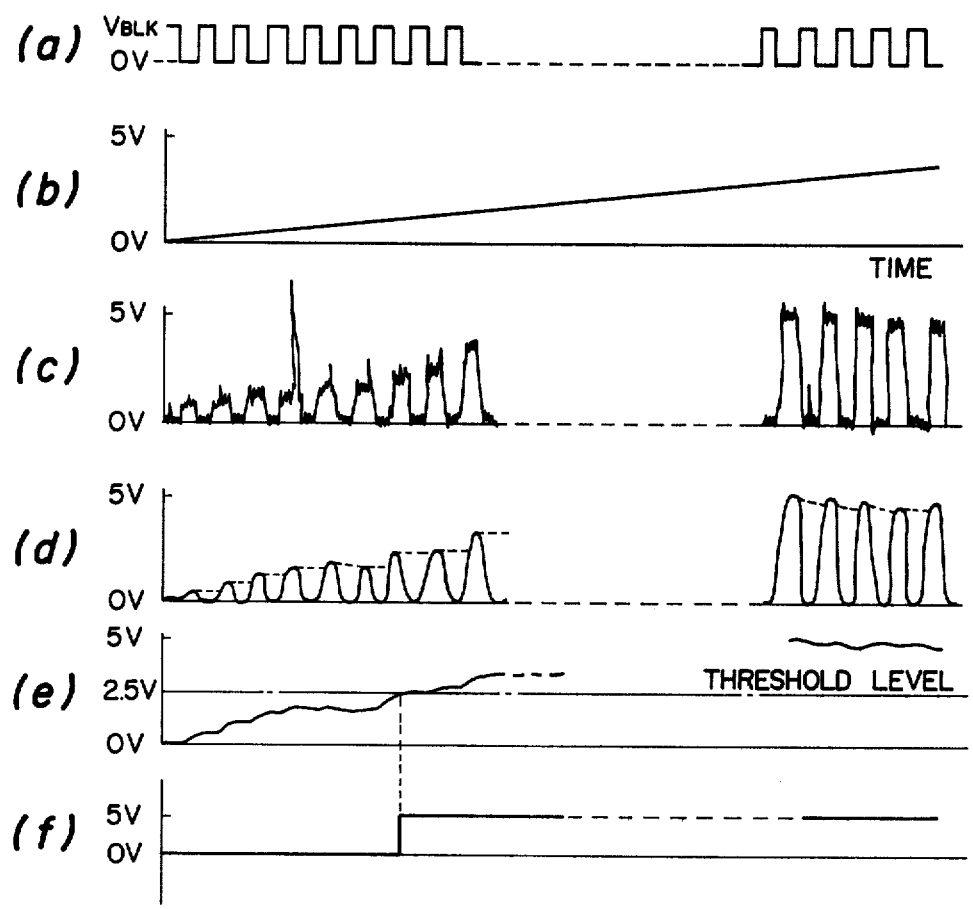

METHOD OF DETECTING A MARK BY AN ELECTRON BEAM AND AN APPARATUS THEREFOR

BACKGROUND OF THE INVENTION

This invention relates generally to a method of detecting a mark by an electron beam. More particularly, the present invention relates to a method to be used for detecting with a high level of accuracy the position of a mark for positioning provided on a sample face in an apparatus for electron-beam lithography and the like.

Mark detection systems in an apparatus for electron-beam lithography are generally directed to carry out positioning of a sample (mask or wafer) and measurement of the deflecting distortion of a beam system.

When a region formed by depositing a gold (Au) evaporation mark 3 (or a silicon, recessed step mark) onto the surface of a silicon (Si) substrate 2 is scanned by an electron beam as pictured in FIG. 1A, there is obtained on a solid state detector 4 a detected mark signal 5 due to the reflected electrons as shown in FIG. 1B.

A well-known fundamental method of detecting the position of a mark comprises amplifying a mark signal produced as the output from the solid state detector 4 to a suitable level, binary-coding the amplified signal at a certain threshold voltage, measuring the time from the initiation of scanning until the generation of the binary-coded pulse, and determining the position of the mark relative to the scanning starting point from the scanning speed of the beam and the measured time. In other words, assuming that the scanning speed of the beam is v (m/sec) and the time required for the binary-coded pulse signal to be obtained is t (sec), it is possible to find out that the position of the mark is separated by a distance of v.t (m) from the starting point of the scanning.

It is possible, in principle, to detect the position of the mark in accordance with the above-mentioned method. However, a number of problems occur in actually practicing this prior art method. For example, in using this method there is a lowering of the signal-to-noise ratio (S/N) of the detected mark signal. The degree of this lowering of S/N naturally varies depending on the fluctuation of the beam current emitted from an electron gun, the fluctuation of sensitivity characteristics of the solid state detector, the shape and size of the mark, the material of the mark and so forth. In any case, however, S/N is definitely lowered using this method.

Another problem in using this method is that it frequently happens that the accurate mark position cannot be detected when the binary-coded pulse signal is generated at a position different from a predetermined position because impulsive external noise generated by other instruments mixes with the detected mark signal. The impulsive noise can be removed to some extent by using a reinforcing electromagnetic and electrostatic shield, but such removal is not complete. At the same time, since S/N of the detected mark signal is inferior, it is difficult to determine a threshold level of a binary-coding circuit where a number of pulses occur at positions other than the predetermined position and accurate detection of the position becomes unfeasible.

To solve these problems, there has conventionally been practiced a method which scans the position of the same mark a number of times, say, 100 times, and determines the mean value as the position of the mark. According to this method, however, the positioning-detection is not only time-consuming but also the accuracy of detection is not entirely satisfactory.

SUMMARY OF THE INVENTION

The present invention contemplates providing a solution for the above-mentioned problems, and is directed to improving the signal-to-noise ratio (S/N) and accuracy of detection as well as speeding up the detection speed in the detection of the mark signal.

The method of the present invention to accomplish the above-mentioned objects comprises scanning the electron beam over an area of the mark on a sample in such a manner that the electron beam is subjected to chopping by sample pulses having a much higher frequency than the scanning frequency, eliminating a component of noise from a detected signal representative of the mark, synchronously rectifying the detected mark signal, binary-coding the detected mark signal as compared with a suitable threshold value, and detecting a position of the mark by using the binary-coded signal.

BRIEF DESCRIPTION OF THE DRAWINGS

FIG. 3 shows waveforms at positions (a) through (f) shown in FIG. 2.

DETAILED DESCRIPTION OF THE PREFERRED EMBODIMENTS

Hereinafter, the present invention will be explained with reference to embodiments thereof.

Figure 2:
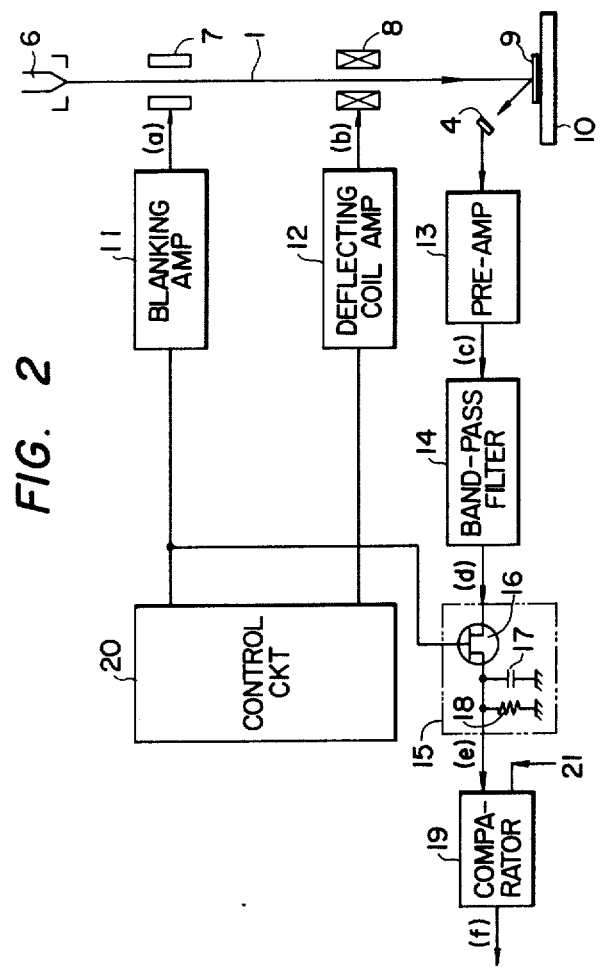
FIG. 2 shows a block diagram of an embodiment of the present invention.
Figure 1A:
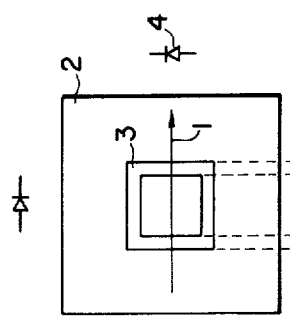
FIG. 1A shows an area of the mark on the surface of a sample.
Figure 1B:
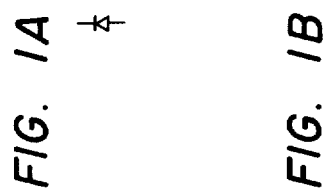
FIG. 1B shows the detected mark signals obtained when the electron beam is scanned over the mark.

FIG. 2 shows an embodiment of the present invention. The electron beam 1 emitted from the electron gun 6 passes through various electron lenses and then irradiates a sample 9 placed on an X-Y stage 10. This electron beam 1 is caused to scan an area on the surface of the sample 9, where the mark is present, by means of a beam deflecting system consisting of a control circuit 20, a deflecting coil amplifier 12, and a deflecting coil 8. In the present invention, a sampling pulse having much higher frequency than the deflecting frequency such as shown in FIG. 3(a) (e.g. pulses of 100 KHz–500 KHz v. a gradient (speed) of 2 mm/40 ms at a deflecting voltage having a frequency of 5 Hz–5 KHz such as shown in FIG. 3(b) in this embodiment) is applied from the control circuit 20 via a blanking amplifier 11 to a blanking plate 7 to turn on and off the electron beam 1.

As a result, the electron beam 1 is chopped by the sampling pulse and, at the same time, the mark signal detected by a detector 4 (such as a solid state detector, for example) is similarly chopped. The signal-to-noise ratio at this point is not at all improved relative to the prior art method. After this signal is amplified by a pre-amplifier 13 to a suitable level below the amplifier's saturation level, it is applied as an input to a band-pass filter 14 having a narrow-band (e.g., band width of 1 KHz–5KHz in this embodiment) conforming with the fundamental frequency of the above-mentioned sampling pulse. In FIG. 3, line (c) represents an example of the preamplifier output of the detected mark signal. Line (d) of FIG. 3 represents the band-pass filter output. Incidentally, a selective amplifier having the above-mentioned band width may be used in place of the band-pass filter 14.

As it is passed through the filter 14, the detected mark signal containing the original signal component and noise components having a number of spectra superposed with one another is converted into the fundamental wave component having the sampling frequency shown in FIG. 3(d) and the noise outside the band of the filter is removed. Therefore, the signal-to-noise ratio (S/N) is drastically improved. For further binary-coding this signal, the signal is applied as an input to a synchronizing rectifier 15 consisting of a FET (Field-Effect Transistor) switch 16, a capacitor 17 and a resistor 18 so as to detect an envelope of the signal waveform. Next, the output signal from the synchronizing rectifier 15 is compared with a suitable threshold value 21 (e.g., a threshold value about ½ the maximum output signal of the synchronizing rectifier 15 in this embodiment) as shown in FIG. 3(e), and a quality binary-coded signal is then obtained by a comparator 19 such as shown in FIG. 3(f).

In this manner, the electron beam is scanned over the mark area on the sample while it is being chopped by the sampling pulse having a frequency far higher than the scanning frequency in addition to deflection at a predetermined scanning speed by the beam deflecting system, and after the resulting detected mark signal from the detector is amplified to a suitable signal level by the pre-amplifier, it is applied as input to the band-pass filter having a narrow-band conforming with the fundamental frequency of the above-mentioned sampling frequency. The output thus obtained is then rectified synchronously and is compared with a suitable threshold value thereby to obtain a binary-coded signal having a remarkably improved S/N. The time from the start of scanning until the occurrence of the binary-coded pulse is measured in the aforementioned manner using this binary-coded signal having a high level of accuracy. The position of the mark can be detected from this time and the scanning speed of the electron beam.

Though the present invention has been explained with reference to the above-mentioned typical embodiment, it is to be understood that the present invention is in no way restricted to this embodiment or to the particular values illustrated therein, but can be modified suitably.

As set forth in the foregoing description, the present invention enables improvement of the signal-to-noise ratio of the detected mark signal by between about 30 to 100 times that of the conventional method, and prevents lowering the mark positioning accuracy arising from mixture of impulsive external noise and line inductive noise (50 Hz/60 Hz hum) into the deflecting system. Hence, the present invention provides great practical effects.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A method of detecting a mark on a sample by an electron beam including the steps of:
   scanning the electron beam over an area of the mark provided on the sample in such a manner that the electron beam is subjected to chopping by sampling pulses having a higher frequency than the scanning frequency;
   detecting the electron beam with a detector after the beam has scanned over said mark to produce a detected mark signal representative of the mark;
   eliminating a component of noise from the detected mark signal;
   synchronously rectifying the detected mark signal after removal of the noise component;
   binary-coding the rectified detected mark signal as compared with a threshold value; and
   detecting the position of the mark by using the binary-coded signal.

2. The method of detecting a mark by an electron beam as defined in claim 1, wherein the detected mark signal obtained from the detector is applied as the input to a band-pass filter having a band width conforming with the fundamental frequency of the sampling pulses to eliminate the noise component contained in the detected mark signal.

3. The method of detecting a mark by an electron beam as defined in claim 2, wherein the detected mark signal is amplified by a pre-amplifier to a suitable signal level where the amplifier does not cause saturation before it is applied as an input to the band-pass filter.

4. The method of detecting a mark by an electron beam as defined in claim 1, wherein the threshold level is set to about ½ the maximum rectified mark signal level.

5. The method of detecting a mark by an electron beam as defined in claim 1, wherein the detected mark signal is applied as an input to a selective amplifier having a band width conforming with the fundamental frequency of the sampling pulses to eliminate the noise component contained in the detected mark signal.

6. The method of detecting a mark by an electron beam as defined in claim 1, wherein after the noise component contained in the detected mark signal is eliminated therefrom, the detected mark signal is applied as an input to a synchronizing amplifier to detect an envelope of the signal waveform.

7. The method of detecting a mark by an electron beam as defined in claim 1, which measures the time from the start of scanning until the occurrence of the binary-coded pulse using the binary-coded signal and detects the position of the mark from the measured time and the scanning speed of the electron beam.

8. An apparatus for detecting a mark by an electron beam comprising:
   means for scanning the electron beam over an area of the mark provided on the sample;
   means for chopping the electron beam by sampling pulses having a higher frequency than the scanning frequency;
   means for detecting the electron beam with a detector after the beam has scanned over the mark to produce a detected mark signal representative of the mark;
   means for eliminating a component of noise from the detected mark signal;
   means for synchronously rectifying the detected mark signal after removal of the noise component;
   means for binary-coding the rectified detected mark signal as compared with a threshold value; and
   means for detecting the position of the mark by using the binary-coded signal.

9. The apparatus for detecting a mark by an electron beam as defined in claim 8, wherein the means for eliminating the noise component comprises a band-pass filter having a band width conforming with the fundamental frequency of the sampling pulses.

10. The apparatus for detecting a mark by an electron beam as defined in claim 9, further comprising a preamplifier coupled between the detecting means and the band-pass filter to amplify the detected mark signal to a suitable signal level where the amplifier does not cause saturation prior to applying the detected mark signal to the band-pass filter.

11. The apparatus for detecting a mark by an electron beam as defined in claim 8, further comprising means for setting the threshold level to about ½ the maximum output signal of the synchronous rectifier.

12. The apparatus for detecting a mark by an electron beam as defined in claim 8, wherein the means for eliminating the noise component in the detected mark signal is a selective amplifier having a band width conforming with the fundamental frequency of the sampling pulses.

13. The apparatus for detecting a mark by an electron beam as defined in claim 8, wherein the synchronous rectifier comprises a synchronizing amplifier for detecting an envelope of the signal waveform.

14. The apparatus for detecting a mark by an electron beam as defined in claim 8, wherein the means for detecting the position of the mark comprises means for measuring the time from the start of scanning until the occurrence of the binary-coded pulse using the binary-coded signal and determining the position of the mark from the measured time and the scanning speed of the electron beam.

* * * * *